United States Patent [19]

Geittner et al.

[11] Patent Number: 5,049,406
[45] Date of Patent: Sep. 17, 1991

[54] METHOD OF MANUFACTURE SOLID BODIES

[75] Inventors: Peter E. E. Geittner, Aachen; Hans-Jürgen Lydtin, Stolberg, both of Fed. Rep. of Germany

[73] Assignee: U.S. Philips Corporation, New York, N.Y.

[21] Appl. No.: 378,555

[22] Filed: Jul. 11, 1989

[30] Foreign Application Priority Data

Jul. 16, 1988 [DE] Fed. Rep. of Germany ....... 3824273

[51] Int. Cl.$^5$ ............................................... B05D 3/06
[52] U.S. Cl. ..................................... 427/53.1; 427/38; 427/39
[58] Field of Search ........................... 427/53.1, 38, 39

[56] References Cited

U.S. PATENT DOCUMENTS

| 4,066,527 | 1/1978 | Takagi et al. | 427/39 |
| 4,581,113 | 4/1986 | Morimoto et al. | 427/39 |
| 4,701,592 | 10/1987 | Cheung | 427/53.1 |
| 4,799,454 | 1/1989 | Ito | 427/39 |
| 4,873,119 | 10/1989 | Akhtar et al. | 427/39 |
| 4,892,751 | 1/1990 | Miyake et al. | 427/53.1 |

Primary Examiner—Shrive Beck
Assistant Examiner—Marianne L. Pedgett
Attorney, Agent, or Firm—Norman N. Spain

[57] ABSTRACT

A substrate (35) is coated by using starting materials which are supplied in the form of clusters (28). The clusters are disintegrated into their molecular or atomic constituents, and the constituents are deposited on the substrate in the form of compact layers (34). In this manner it is attained that the layers have a defined structure and do not exhibit inclusions in the form of foreign molecules.

7 Claims, 1 Drawing Sheet

METHOD OF MANUFACTURE SOLID BODIES

The invention relates to a method of manufacturing solid bodies by coating a substrate, making use of at least one starting material which is supplied in the form of clusters.

Clusters are to be understood to mean herein submicroscopic solid particles having geometrical dimensions in the range from a few nanometers to several hundred nanometers, typically, in the range from 1 to 100 nm, as well as agglomerates of such particles having dimensions of up to 1 μm.

Methods of the type described in the opening paragraph are known from, for example, GB-PS 15 41 798 and the corresponding DE-AS 27 21 198, and from DE-PS 33 35 107, DE-OS 36 11 663, DE-PS 36 28 443 and EP-PS 51 639. The known methods have in common the clusters, also referred to as micronuclei or particles in these Specifications, are deposited as such on the substrate. This has the disadvantage that porous layers are formed which must be sintered for the manufacture of compact layers, so that an additional process step is required. Sintering involves the risk of the layers becoming contaminated. The high temperatures required during sintering may lead to reevaporation of the deposited material and/or to rearrangements and diffusion inside the layers and, hence, to structural changes. Moreover, there is the risk of sedimentation during deposition, i.e., a particle separation according to size, which leads to undesirable inhomogeneities in the deposited material.

The methods known from DE-PS 33 35 107, DE-OS 36 11 663, DE-PS 36 38 443, and EP-PS 51 639 have in common that they are conducted in vacuum. This has the disadvantage that restrictions regarding geometry and composition of the deposited layers may apply.

It is an object of the invention to provide a method of manufacturing compact solid bodies which have a well-defined structure and which do not include foreign molecules.

According to the invention, this object is achieved in that in a method of the type described in the opening paragraph the clusters are disintegrated into their molecular or atomic constituents which are then deposited on the substrate in the form of compact layers.

The clusters are supplied in a measured amount (dosed), preferably, by means of a carrier-gas stream. This has the advantage that the location where the clusters are manufactured can be spatially separated from the location where the clusters are disintegrated and deposited, so that all the advantages of gas-phase dosing processes (mixing, transporting) can also be applied to clusters.

DETAILED DESCRIPTION OF THE PREFERRED EMBODIMENTS

Figure 1:
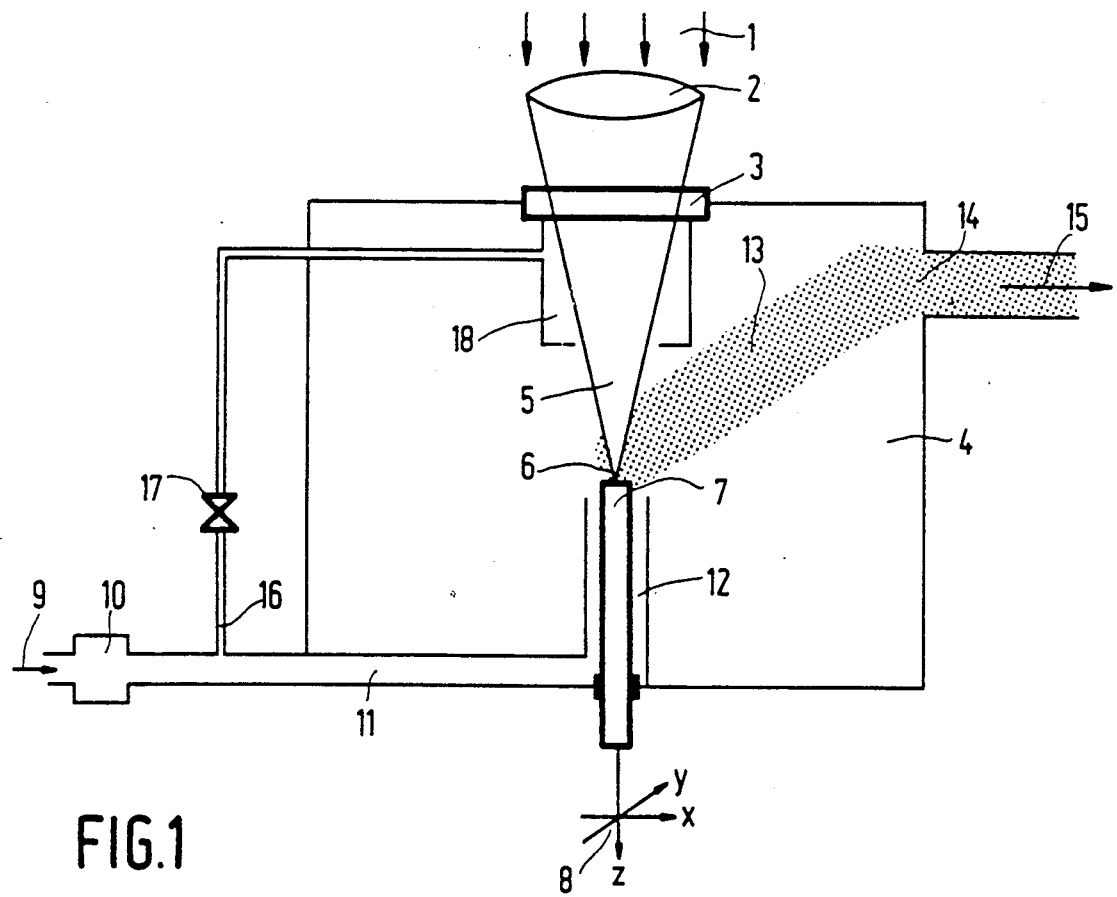
FIG. 1 is a schematic representation of an arrangement for forming clusters by means of laser radiation.

According to the invention, pure solid or liquid starting materials may be employed. The clusters may be formed in an inert atmosphere such as a noble gas, a non-reactive atmosphere (for example $H_2$, CO, $N_2$) or a reactive atmosphere (for example $O_2$, $CL_2$ or F) at a pressure that may range for example from 1 hPa to atmospheric pressure. When the clusters are manufactured in an inert environment, any contaminations can be substantially removed in the subsequent deposition process.

Preferably, pure non-metallic elements, metals, transition metals, rare earths, and the oxides and sulphides thereof, are used as the starting materials.

The method according to the invention enables difficultly volatile pure substances to be used as the starting materials, even at temperatures below 200° C. Thus, the method according to the invention has a decisive advantage over the known CVD methods. The advantages of the known methods reside in the use of highly-pure gaseous starting materials which are accurately mixed and dosed in the gas phase, as well as the contamination-free transport of these gas mixtures into the reaction zone; the condensable reaction products formed in the CVD reaction process can then be deposited either homogeneously in the gas phase (in the form of soot or clusters) or on extended substrate surfaces (in the form of compact layers) with a high degree of purity. A defined variation in the gas-phase composition during the deposition of several successive layers (multilayer structure) enables an accurate variation or structuring of the material properties of the solid body deposited. However, the required use of gaseous starting substances forms a substantial restriction of the known CVD methods.

In contrast, the field of application of the method according to the invention is not limited to material systems whose starting materials are gaseous at room temperature or exhibit a sufficiently high vapour pressure. An increase of the vapour pressure of difficultly volatile (for example, liquid or solid) substances by heating, which generally requires a large investment in equipment to avoid recondensation during transport, is not required for example, the heating of the entire dosing and transport system, while also running the risk of thermal reactions partly taking place in the storage vessel or during transport to the reactor, is not required in the method according to the invention. Consequently, the range of usable starting substances having low vapour pressures is considerably increased. Changing over to organic compounds having a high vapour pressure and a low disintegration temperature, as in the case of MOCVD (Metal Organic CVD), is not required either according to the invention. The use of such organic compounds leads to an increase of the problems regarding the handling and disposal because of the presence of (very toxic substances) and contamination of the deposited materials with reaction by-products (such as, for example, the inclusion of hydrogen and carbon). The invention affords the possibility of employing many material systems such as, for example, the elements of the first and second group of the periodic table as, starting substances suitable for coating.

A further disadvantage of the known CVD method in which only thermal reaction activation is used, is that in the case of deposition of multi-component or doped solid bodies the gaseous compounds do not disintegrate simultaneously due to the difference in molecular bonding strength. This always leads to a solid body whose composition depends on the position of the substrate in the reactor.

A further restriction of the thermal CVD method in the manufacture of compact solid bodies (for example epitaxial layers) is the necessity to avoid homogeneous gas-phase reactions with a subsequent homogeneous nucleation. In this case, the restriction requires the selection of the temperature so that essentially only reactions on the substrate surface are permitted. This restriction leads to extremely low deposition rates and long contamination times.

A possibility of circumventing these disadvantages is provided by the plasma induced chemical vapor deposition method hereinafter termed PCVD method. This method enables accurately doped equilibrium solid structures and non-equilibrium solid structures, for example, for optical fibres and tungsten-thorium cathodes, to be deposited on extended substrates in a composition which is independent of the location. However, it has been found that at low substrate temperatures this method leads to an undesired inclusion of molecular residue (Cl, H, C) into the solid body. In many applications, the imperfections in the structure caused thereby cannot be tolerated; they can only be avoided in a system-dependent manner by raising the substrate temperature to values between 500° C. and over 1000° C. All of these disadvantages are also avoided by the method according to the invention.

According to the invention, the clusters are formed locally and directly over a heated surface of the starting material used, preferably in a gas steam whose parameters (type, pressure, temperature) are known and the flow of which is accurately defined. Although the starting material classically evaporates in atomic form at high temperatures, the desired cluster formation at the edge of the localized high temperature zone occurs at gas temperatures which also enable a transport of the gas-cluster mixture, i.e. of an aerosol, without the above disadvantages of the known methods. By virtue of the measure according to the invention, the "apparent solubility" of difficultly volatile elements or compounds can be increased at the permitted transport temperatures by orders of magnitude exceeding the typical vapour pressure values at these temperatures. "Apparent solubility" is to be understood to mean herein the vapor pressure value which is obtained when the clusters contained in a specific gas volume are decomposed again into the elementary components of atoms or molecules.

The clusters are preferably formed by means of laser evaporation, in a thermal process or, for example, by means of a PCVD method. Thus, solid or liquid clusters can be manufactured according to different methods known from literature. These include thermal evaporation using $CO_2$ lasers, ablation of polymers using UV lasers, metering submicroscopic liquid drops into a gas phase (ink-jet process) and the classical thermal flame hydrolysis or CVD method are mentioned by way of example. The wide spectrum of these methods makes it possible to manufacture clusters from very different materials (pure metals, oxides, liquids etc.) A described in the opening paragraph the geometrical dimensions of the clusters may range from a few nanometers up to and including one micrometer, the size distributions being adjustable to the specific process by measures such as, for example, adiabatic expansion into a vacuum through high-pressure nozzles, injection into buffer-gas atmospheres and freezing out on cooled substrates. In the case of the particularly advantageous cluster formation through PCVD, the appropriate conditions clearly differ from those which apply to the optimum PCVD parameters for the manufacture of optical fibres (higher pressures, lower temperatures and lower plasma performances).

In the next process step, the clusters manufactured in a separate reaction space, according to the above-described embodiment of the invention, are supplied to the actual reaction space, in a carrier-gas stream through a conveying pipe, in which reaction space they are redisintegrated and deposited as mono-component material. The major transport problems are, in particular, the possible loss of cluster material due to sedimentation on the inner walls of the conveying pipe as well as electrostatic charging effects occurring in connection therewith which enhance agglomeration of the clusters relative to each other and, hence, reduce the homogeneity of the gas-phase load.

Well-known measures to maximally reduce sedimentation and contacts between powder particles and the walls of the pipes are the use of protective-gas streams which annularly surround the carrier-gas stream, the heating of the walls of the pipe and the application of ultrasonic fields to the conveying pipes. It is also known that the relevant thermophoretic driving forces and, hence, the radical motion components of the particle assembly can be enlarged by imposing increased radial temperature gradients in the surrounding gas phase; examples of the use of this technique of increasing the sedimentation rates for $SiO_2$-soot deposition in thermal internal-coating processes are the process modifications of plasma and laser supported MCVD (PMCVD and LMCVD, described for example DE-OS 27 12 993). It has however been found that in the present case, the above-described method of increasing the drift velocities of the particles towards the wall of the pipe not an appropriate measure for transporting the cluster flow in a contact-free manner.

According to the invention, these problems are very effectively solved in that for conveying the clusters and focussing them on the axis of the cluster carrier-gas stream a laser beam is used which is oriented so as to be parallel to that axis, and which has an annular intensity distribution which is concentric with that axis, which laser beam has a maximum energy density in the outer region surrounding the cluster-carrier-gas stream, and a minimum energy density on that beam axis. Thus, losses caused by reaction, sedimentation or deposition during transport before reaching the CVD reaction zone can be kept at a low level by the use of a powerful laser, the laser beam being coaxially oriented relative to the cluster stream, and its radial intensity distribution being determined by optical components, for example beam-expansion means, annular-aperture diaphragms or lenses, in such a way that the optical power density is maximal in the outer region surrounding the cluster stream and is clearly reduced and preferably zero in the inner region, particularly in the centre of the cluster stream. When suitable lasers (for example $CO_2$ lasers) are used a peripheral substantially homogeneous temperature field having distinct radial temperature gradients can be produced through the absorption of optical power in the carrier and ambient-gas phase, while the direction of these temperature gradients leads to an increase of the thermophoretic forces acting on the clusters in the direction of the beam axis and, hence, to a "focussing" of the cluster stream. In the case that the clusters absorb in the emission wavelength range of the laser, the thermophoretic focussing effect is additionally enhanced in that clusters (having a high power density)

drifting in the outer region can be directly heated by the laser beam and, in the case of a correspondingly high absorption or laser power, can even be evaporated (re-condensation, preferably in a low gas-temperature range, i.e., in the central region of the cluster stream, can take place).

Further specific advantages of the laser application preferred according to the invention, are the flexibility with which the temperature fields can be adapted, regarding the geometry and value of the radial temperature gradients, to the dimensions of the predetermined cluster stream; this adaptation can be carried out in a very simple manner by means of optical systems for variable beam expansion and laser power. In the case of poor focussing or expansion of the annular laser beam, the above-described mechanisms can even be used to reduce or enlarge the cluster stream along the direction of propagation (weakly convergent or divergent cluster-flow profile), within given limits relating to its cross-section.

This contact between the clusters and the inner walls of the conveying pipe can be effectively avoided in a simple manner and the cluster stream can be introduced into the actual reaction space substantially without making any contact.

It is very advantageous to convey the cluster stream in a pipe which exhibits an increase in wall temperature between the location where the cluster is formed and the location where it is deposited. In this manner, cluster deposition on the walls of the conveying pipes is also avoided.

Preferably, the clusters are introduced into a plasma zone where they are disintegrated. Thus, the formation of clusters and their metering into the carrier-gas stream is carried out outside the reaction zone used for the disintegration of the clusters. Charging the gas stream with clusters permits high transport rates of the material to be deposited.

In a version of this preferred embodiment according to the invention, a reaction takes place in the plasma zone, which differs from the known CVD reactions in that clusters are used as the starting materials instead of volatile gaseous compounds, which clusters are introduced in doses into a carrier-gas stream and are conveyed with the carrier-gas stream into the plasma zone. The clusters are subsequently disintegrated in the plasma zone, preferably by a non-isothermal low-pressure microwave plasma discharge, and are directly deposited on the substrates.

In the disintegration step, the initial cluster-size distributions and material compositions, the clusters are subjected to specific changes. In this connection, in particular the disintegration and deposition of cluster material by means of PCVD (Plasma-Induced CVD) and LICVD (Laser-Induced CVD) conditions has all the specific advantages of these methods regarding geometric uniformity, structuring and purity of the materials.

In the disintegration of the clusters and the deposition of the cluster material on substrates in the form of compact homogeneous and uniform layers, a behaviour which typically takes place under PCVD conditions and is used such that for sufficiently small cluster dimensions the cluster temperature can be increased during the retention time of the particles in the microwave plasma by energy absorption, such that an evaporation or disintegration of the clusters in the range of the PCVD plasma zone is possible. Obviously, this behaviour clearly surpasses the methods employed in the present state of the art, in which under optimum PVCD conditions a homogeneous deposition reaction, i.e. soot formation in the gas phase, does not occur. In the case of clusters having a low electric conductivity (for example $SiO_2$) possible energy-transmission mechanisms are the absorption of recombination energy when highly excited/dissociated $O_2$ molecules and clusters collide, and, in addition, in the case of clusters having a high electric conductivity, the direct absorption of microwave energy in the electric field of the plasma-generating microwave resonator. According to the method of the invention, in both cases a disintegration of the clusters followed by a deposition of the cluster contents on the substrates can be attained, independently of the special energy-transmission mechanisms.

The advantages obtained by disintegrating the clusters and subsequently depositing them consist, particularly, in that in addition to the possibility of using almost any materials, full advantage can be taken of all the specific-PCVD advantages regarding geometric uniformity, structural accuracy and purity of the deposited material layers.

Besides re-evaporation may also using a plasma, re-evaporation be carried out by the use of a high-power laser.

The invention will be explained in greater detail by means of several embodiments and with reference to the accompanying drawings and examples.

FIG. 1 is a schematic representation of an arrangement for manufacturing clusters and for metering them into a carrier-gas stream which is defined with respect to its volume flow. The arrangement allows laser beams 1 originating from a laser (not shown) to be focussed to a beam path 5 through a collecting lens 2 and an entrance window 3 which is transparent to the laser beams and which is fitted in a wall of an evaporation vessel 4, which beam path is incident on a mold body 7 at the location of a focal point 6. The molded body is composed of a starting material which is to be evaporated, and is arranged in the evaporation vessel.

When the laser radiation is sufficiently absorbed, the high energy density obtained by the above measure leads to a local increase in temperature of the surface of the molded body 7, and to evaporation of starting material in the gas phase. In this connection, it is important that the evaporation takes place from its natural environment and that a possibly detrimental contamination with materials of the evaporation vessel is impossible.

A uniform removal of starting material is ensured by a movement of the molded body 7 relative to the optical beam path 5, the movement being brought about by a symbolically indicated device 8, the directions of movement of which are designated x, y and z.

The starting material which is removed from the surface of the molded body 7, in atomic or molecular form, firstly by evaporation, is introduced into a gas stream (arrow 9) which is supplied to a nozzle-like device 12 through a gas-flow meter 10 and a pipe 11, the nozzle-like device guiding the gas flow along the heated surface of the molded body 7, in such a manner that recondensation of the just evaporated material on the surface itself is substantially excluded. Close above the surface of the molded body facing the optical beam path 5, and at the side of the focal point 6 the desired cluster formation 13 takes place in the gas phase; the clusters are carried away by the gas stream to an outlet 14 of the evaporation vessel 4, as indicated by an arrow 15. To preclude that the inlet window 3 is covered with clusters, a sub-stream of the gas stream is introduced as a purge gas into a protective space 18 through a branch pipe 16 having a valve 17.

EXAMPLE 1

The Manufacture of Clusters from $SiO_2$, by Using a High-Power $CO_2$ Laser, and Measures to Ensure that They are Continuously Metered into a Carrier-Gas Stream By means of the arrangement shown in FIG. 1, and using a 800 W $CO_2$ laser, a ZnSe lens, an $O_2$ carrier-gas stream of 500 sccm (standard cubic centimetres per minute) and a $SiO_2$ plate which is displaced relative to the beam path and which has the dimensions 3 mm × 10 mm × 300 mm, uniform evaporation rates of 0.1 g of $SiO_2$ per minute were obtained. Almost 100% of the evaporated material was present in the form of clusters, i.e., submicroscopic particles having diameters from approximately 10 to approximately 100 nm, 90% of which was removed from the evaporation vessel. The evaporation of the material and the formation of clusters took place at a pressure of 200 hPa.

Figure 2:
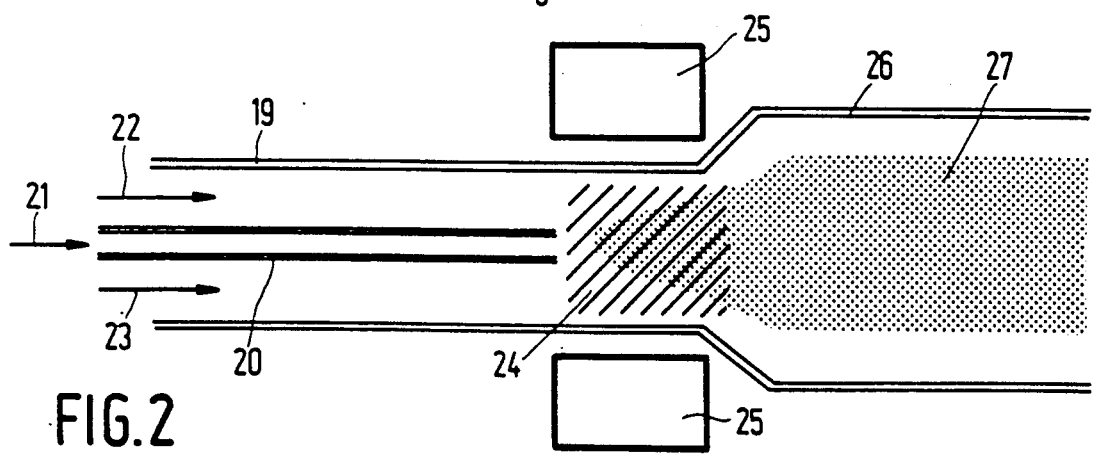
FIG. 2 is a schematic representation of an arrangement for forming clusters by means of microwaves.

The above embodiment is based on a direct conversion of difficultly volatile elements and compounds, without substantial chemical changes. The next embodiment, however, is based on the manufacture of clusters in a gas containing volatile compounds, by using a partial plasma discharge. FIG. 2 which accompanies the next example shows an arrangement for carrying out this concept.

EXAMPLE 2

The Manufacture of Clusters Using a Microwave Plasma

Referring to FIG. 2, $SiCl_4$ (arrow 21) was led through a quartz tube 20 which is centrally arranged in a quartz tube 19 at a flow rate of approximately 150 sccm, together with 400 sccm $O_2$ (arrows 22 and 23) which flowed in a direction parallel to $SiCl_4$ in the cylindrical annular space between the tubes 19 and 20, and the $SiCl_4$ was introduced into a reaction zone 24 formed by a microwave plasma. The power supplied by a microwave resonator 25 was 400 W. The plasma power applied, the overall pressure of 16 hPa and the inner diameter of 26 mm of the quartz tube 26 were selected so that, unlike in the manufacture of optical fibres according to the PCVD method shown in DE-OS 29 29 166, a deposition of compact $SiO_2$ layers did not take place. Rather, only a molecular disintegration took place which can be attributed to the small power applied, however, the natural (thermodynamically required) homogeneous formation of nuclei and clusters 27 in the gas phase was not suppressed. These measures result in a substantial production of clusters having diameters typically ranging from 10 to 100 nm (10 nm—elementary particles, 100 nm—agglomorates of elementary particles). Under the indicated test conditions, a $SiO_2$ cluster yield of approximately 35% of the material used was obtained.

EXAMPLE 3

The Manufacture of Compact Layers by Means of Cluster Disintegration in the Gas Phase and Molecular or Atomic Diffusion into and Condensation on a Substrate An aerosol composed of $SiO_2$ clusters and oxygen gas was used as the starting material. Typical dimensions of the $SiO_2$ clusters range between 10 and 100 nm. The clusters were in accordance with the $SiO_2$ clusters described in the examples 1 and 2.

Figure 3:
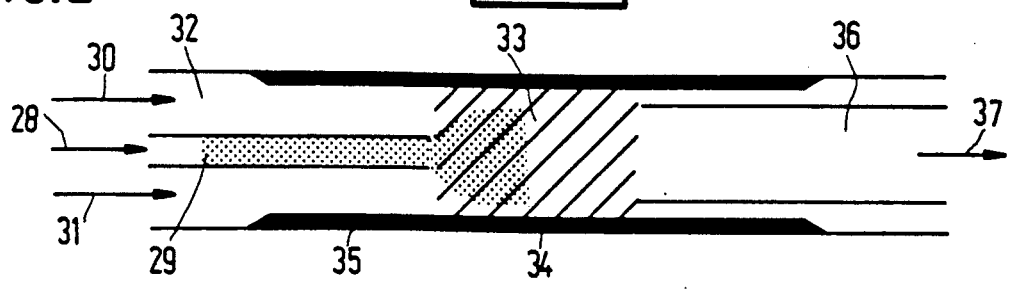
FIG. 3 is a schematic representation of an arrangement for disintegrating clusters and forming compact layers.

As shown in FIG. 3, a gas stream (arrow 28) which was charged with approximately 0.1 g $SiO_2$/400 sccm $O_2$ was led through a central quartz tube 29, and parallel to approximately 600 sccm $O_2$ (arrows 30 and 31) which were led through an annular space 32, into a reaction zone 33 which was formed by a microwave plasma. By virtue of the application of a high power of 5 kW, a substantially complete disintegration of the $SiO_2$ clusters and a molecular condensation in the form of an approximately 0.5 mm thick compact layer 34 on a substrate tube 35 was obtained, said substrate tube moving forwards and backwards 20 times during the 30 min. test period. Residual gases were exhausted (arrow 37) through an exhaust tube 36 by means of a pump (not shown), thereby excluding a possible contamination of the deposited layers by residue.

We claim:

1. A method of manufacturing solid bodies by coating a substrate by employing at least one starting material supplied in the form of clusters, which clusters are metered by a carrier-gas stream, which clusters are conveyed to and focussed on the axis of the carrier-gas stream by a laser beam which beam is oriented so as to be parallel to said axis, has an annular intensity distribution which is concentric with said axis, and which laser beam has a maximum energy density in the outer region surrounding the carrier-gas stream at a minimum energy density on its axis, disintegrating said clusters into their molecular or atomic constituents and depositing said constituents on said substrate in the form of compact layers.

2. A method as claimed in claim 1, characterized in that the laser beam is formed by using a $CO_2$ laser having a high output power.

3. A method as claimed in claim 1, characterized in that the geometry of the laser beam is adapted to the predetermined or desired geometry of the cluster stream.

4. A method as claimed in claim 1, characterized in that the cluster containing stream is led through a pipe which exhibits an increasing wall temperature between the location where the cluster is formed and the location where it is deposited.

5. A method as claimed in claim 1, characterized in that the clusters are introduced into a plasma zone.

6. A method as claimed in claim 1, characterized in that the clusters are introduced into a plasma chemical vapor deposition reaction zone.

7. A method as claimed in claim 1, characterized in that the clusters are disintegrated by means of a high-power laser.

* * * * *